(12) United States Patent
Noguchi et al.

(10) Patent No.: US 7,495,389 B2
(45) Date of Patent: Feb. 24, 2009

(54) ORGANIC LIGHT EMITTING ELEMENT INCLUDING AUXILIARY ELECTRODE, DISPLAY DEVICE INCLUDING THE SAME AND METHOD FOR MANUFACTURING THE ORGANIC LIGHT EMITTING ELEMENT

(75) Inventors: Noboru Noguchi, Nara (JP); Akira Tagawa, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 603 days.

(21) Appl. No.: 11/157,889

(22) Filed: Jun. 21, 2005

(65) Prior Publication Data
US 2006/0017375 A1    Jan. 26, 2006

(30) Foreign Application Priority Data
Jul. 22, 2004   (JP) ............................. 2004-214491
Mar. 28, 2005   (JP) ............................. 2005-092088

(51) Int. Cl.
*H01J 1/62* (2006.01)
*H05B 33/00* (2006.01)

(52) U.S. Cl. .................... 313/506; 313/504; 428/690; 315/169.3

(58) Field of Classification Search .......... 313/504–506
See application file for complete search history.

(56) References Cited

U.S. PATENT DOCUMENTS

| | | | |
|---|---|---|---|
| 6,366,025 B1* | 4/2002 | Yamada | 315/169.3 |
| 6,610,552 B2 | 8/2003 | Fujimori et al. | |
| 6,621,213 B2* | 9/2003 | Kawashima | 313/506 |
| 6,727,513 B2 | 4/2004 | Fujimori et al. | |
| 6,781,162 B2 | 8/2004 | Yamazaki et al. | |
| 6,900,470 B2 | 5/2005 | Kobayashi et al. | |
| 7,265,391 B2 | 9/2007 | Yamazaki et al. | |
| 2002/0033664 A1 | 3/2002 | Kobayashi | |
| 2002/0158835 A1* | 10/2002 | Kobayashi et al. | 345/100 |
| 2003/0173891 A1 | 9/2003 | Chiba et al. | |
| 2005/0077814 A1* | 4/2005 | Koo et al. | 313/500 |
| 2007/0114921 A1 | 5/2007 | Yamazaki et al. | |

FOREIGN PATENT DOCUMENTS

| | | | |
|---|---|---|---|
| JP | 05-116324 A | 5/1993 | |
| JP | 2000-323276 A | 11/2000 | |
| JP | 2000-331783 A | 11/2000 | |
| JP | 2001-249627 A | 9/2001 | |

(Continued)

OTHER PUBLICATIONS

Official communication issued in the counterpart Japanese Application No. 2005-092088, mailed on Sep. 18, 2007.

*Primary Examiner*—Sikha Roy
(74) *Attorney, Agent, or Firm*—Keating & Bennett, LLP

(57) ABSTRACT

An organic EL element includes a substrate, a plurality of first electrodes which are arranged on the substrate in a matrix configuration, a wall-like insulating layer which is formed on the substrate, organic light emitting layers which are formed on the first electrodes, respectively, an auxiliary electrode which is formed on top of the wall-like insulating layer and a second electrode which is formed to cover the surfaces of the wall-like insulating layer, the auxiliary electrode and the light emitting layers and electrically connected to the auxiliary electrode. The second electrode is transparent to light from the light emitting layers.

14 Claims, 10 Drawing Sheets

FOREIGN PATENT DOCUMENTS

| | | |
|---|---|---|
| JP | 2002-352963 A | 12/2002 |
| JP | 2003-186420 A | 7/2003 |
| JP | 2003-316291 A | 11/2003 |
| JP | 2003-347048 A | 12/2003 |
| JP | 2004-127551 | 4/2004 |
| JP | 2004-139879 A | 5/2004 |

* cited by examiner

ORGANIC LIGHT EMITTING ELEMENT INCLUDING AUXILIARY ELECTRODE, DISPLAY DEVICE INCLUDING THE SAME AND METHOD FOR MANUFACTURING THE ORGANIC LIGHT EMITTING ELEMENT

CROSS-REFERENCE TO RELATED APPLICATION

This non-provisional application claims priority under 35 U.S.C. §119(a) on Patent Applications Nos. 2004-214491 filed in Japan on Jul. 22, 2004 and 2005-92088 filed in Japan on 28 Mar. 2005, the entire contents of which are hereby incorporated by reference.

BACKGROUND OF THE INVENTION (a) Field of the Invention

The present invention relates to an organic light emitting element, a display device including the same and a method for manufacturing the organic light emitting element.

(b) Description of Related Art

As compared with conventionally used cathode ray tube (CRT) display elements, flat display elements are more power-saving and slimmed down. As a wide variety of information processing apparatuses have been developed in recent years, there is a growing demand for the flat display elements. Examples of the flat display elements include, for example, liquid crystal display elements and electroluminescent display elements (hereinafter referred to as EL display elements). Among them, organic EL display elements have been actively studied because of their features of low voltage drive system, being made of solid material only, quick response and a self-light-emitting property.

The organic EL display elements are classified into those of passive matrix (PM) type and those of active matrix (AM) type depending on the drive system.

A PM organic EL element is driven line by line. Therefore, to realize a PM organic EL element of high luminance, a high instantaneous power must be applied to pixels (light emitting layers). This brings about significant deterioration of the light emitting layers, thereby reducing life of the PM organic EL element. Especially, in an organic EL element including a large number of scanning electrodes (i.e., high definition element), a higher voltage is applied to the pixels. Therefore, the high definition organic EL element is particularly short-life.

On the other hand, since an AM organic EL element includes switching elements (e.g., TFTs) for the respective pixels, switching among the pixels is allowed. For this reason, in principle, there are no limitations on the number of scanning electrodes in the AM organic EL element. Further, every pixel can be driven at almost 100% performance for a single frame.

That is, even if the instantaneous luminance is lower than that of the PM organic EL element, the AM organic EL element allows image display with high luminance and excellent quality. Further, since the AM organic EL element does not require as high instantaneous luminance as the PM organic EL element does, the AM organic EL element offers reduction in drive voltage and long life. Under these circumstances, the AM organic EL element has been actively studied in recent years.

FIG. 14 is a schematic sectional view of a conventional organic EL element 600.

The organic EL element 600 includes a substrate 601 and an organic light emitting layer 603 which is formed above the substrate 601 and sandwiched between a first electrode 602 and a second electrode 604.

The first electrode 602 implants holes into the organic light emitting layer 603, while the second electrode 604 implants electrons into the organic light emitting layer 603. The holes implanted from the first electrode 602 and the electrons implanted from the second electrode 604 are recombined in the organic light emitting layer 603, whereby light emission occurs in the organic light emitting layer 603. The substrate 601 and the first electrode 602 are transparent to light, while the second electrode 604 reflects light. Light emitted by the organic light emitting layer 603 passes through the first electrode 602 and the substrate 601 and is output from the organic EL element 600 (bottom-emission type).

Since the organic EL element 600 is operated by the AM drive system, TFTs and electrodes (pixel electrodes, gate electrodes and source electrodes) are formed on the substrate 601. In general, the TFTs and the electrodes are made of material which is less transparent to light. More specifically, the TFTs are made of silicon which is less transparent to light. Therefore, the AM organic EL element 600 has a problem in that the ratio of a light emitting area to a pixel area (aperture ratio) is low.

The AM organic EL elements are classified into those of current drive system and those of voltage drive system. The current-driven organic EL element reduces variations in display performance of the pixels and effectively prevents deterioration of light emitting material. However, the current-driven organic EL element requires more TFTs to be provided in each pixel than those required in the voltage-driven organic EL element. For this reason, the current-driven organic EL element has a problem of a further decrease of the aperture ratio.

In view of the above problems, top emission organic EL elements have been proposed (for example, see Japanese Unexamined Patent Publication No. 2004-127551). In the top emission organic EL element, the second electrode is transparent to light and the first electrode reflects light. Therefore, light generated in the organic light emitting layer is output from the second electrode side opposite to the substrate side where the TFTs and the electrodes of low light transmittance are provided. Therefore, the top emission organic EL element has a higher aperture ratio than that of the bottom emission organic EL element. That is, the organic EL element is given with high luminance by employing the top emission system.

SUMMARY OF THE INVENTION

In the top emission organic EL element, light generated in the organic light emitting layer is taken out of the second electrode side. Therefore, the second electrode is preferably made of transparent conductive material having high light transmittance. Examples of the transparent conductive material include indium tin oxide (ITO) and indium zinc oxide (IZO).

The transparent conductive material such as ITO has higher electric resistance than that of conventionally used metal material such as silver (Ag) and aluminum (Al). Therefore, the second electrode, if made of the transparent conductive material, shows a high surface resistance. As a result, a high drive voltage is required.

Further, if the surface resistance of the second electrode is high, a drop in voltage occurs in part of the second electrode. Therefore, a uniform voltage cannot be applied to the second electrode made of the highly resistive, transparent conductive material. This leads to a problem in that image display cannot be performed with high uniformity.

The present invention has been achieved in view of the above problems. An object of the present invention is to provide an organic EL element which allows image display with high luminance without causing variations in luminance.

An organic light emitting element according to the present invention comprises: a substrate; a plurality of first electrodes which are arranged on the substrate in a matrix configuration; a wall-like insulating layer which is formed on the substrate and isolates the first electrodes from each other; organic light emitting layers which are formed on the first electrodes, respectively; an auxiliary electrode which is formed on top of the wall-like insulating layer; and a second electrode which is formed to cover the surfaces of the wall-like insulating layer, the auxiliary electrode and the light emitting layers, electrically connected to the auxiliary electrode and transparent to light from the light emitting layers.

In the organic light emitting element of the present invention, the auxiliary electrode is formed on top of part of the wall-like insulating layer and the part of the wall-like insulating layer on top of which the auxiliary electrode is formed is wider than part of the wall-like insulating layer on top of which the auxiliary electrode is not formed.

In the organic light emitting element of the present invention, the part of the wall-like insulating layer on top of which the auxiliary electrode is formed is about twice or more wider than the part of the wall-like insulating layer on top of which the auxiliary electrode is not formed.

In the organic light emitting element of the present invention, sets of two or more of the light emitting layers which are adjacent to each other form pixels, respectively, and the auxiliary electrode is formed on top of the part of the wall-like insulating layer which is wider than the other part thereof and defines the pixels from each other.

In the organic light emitting element of the present invention, each of the light emitting layers is made of any one of different materials which emit lights of different colors, the light emitting layers which emit lights of different colors have different light emitting areas and the auxiliary electrode is formed on top of part of the wall-like insulating layer which is wider than the other part thereof and adjacent to the light emitting layers having the smallest light emitting area.

The organic light emitting element of the present invention may further comprise a liquid repellent layer which is formed between the auxiliary electrode and the second electrode and provided with a through hole which communicates with the auxiliary electrode and the second electrode, wherein the second electrode is electrically connected to the auxiliary electrode via the through hole.

The organic light emitting element of the present invention may further comprise a liquid repellent layer which is a monolayer formed between the auxiliary electrode and the second electrode.

In the organic light emitting element of the present invention, the light emitting layers may contain organic electroluminescent light emitting material.

A display device of the present invention includes the organic light emitting element of the present invention.

A manufacturing method of the present invention is a method for manufacturing the organic light emitting element of the present invention. The manufacturing method comprises the steps of: applying ink by a wet application process; and drying the applied ink to form the light emitting layers.

According to the manufacturing method of the present invention, the wall-like insulating layer may be made of material which is repellent to an organic solvent.

According to the manufacturing method of the present invention, the auxiliary electrode may be subjected to a treatment for giving liquid repellency to form a liquid repellent layer at the top surface of the auxiliary electrode.

According to the manufacturing method of the present invention, the treatment for giving liquid repellency may be a treatment with oxygen plasma and/or tetrafluorocarbon plasma.

DETAILED DESCRIPTION OF THE INVENTION

Hereinafter, with reference to the drawings, a detailed explanation is given of embodiments of the present invention.

Embodiment 1

Figure 1:
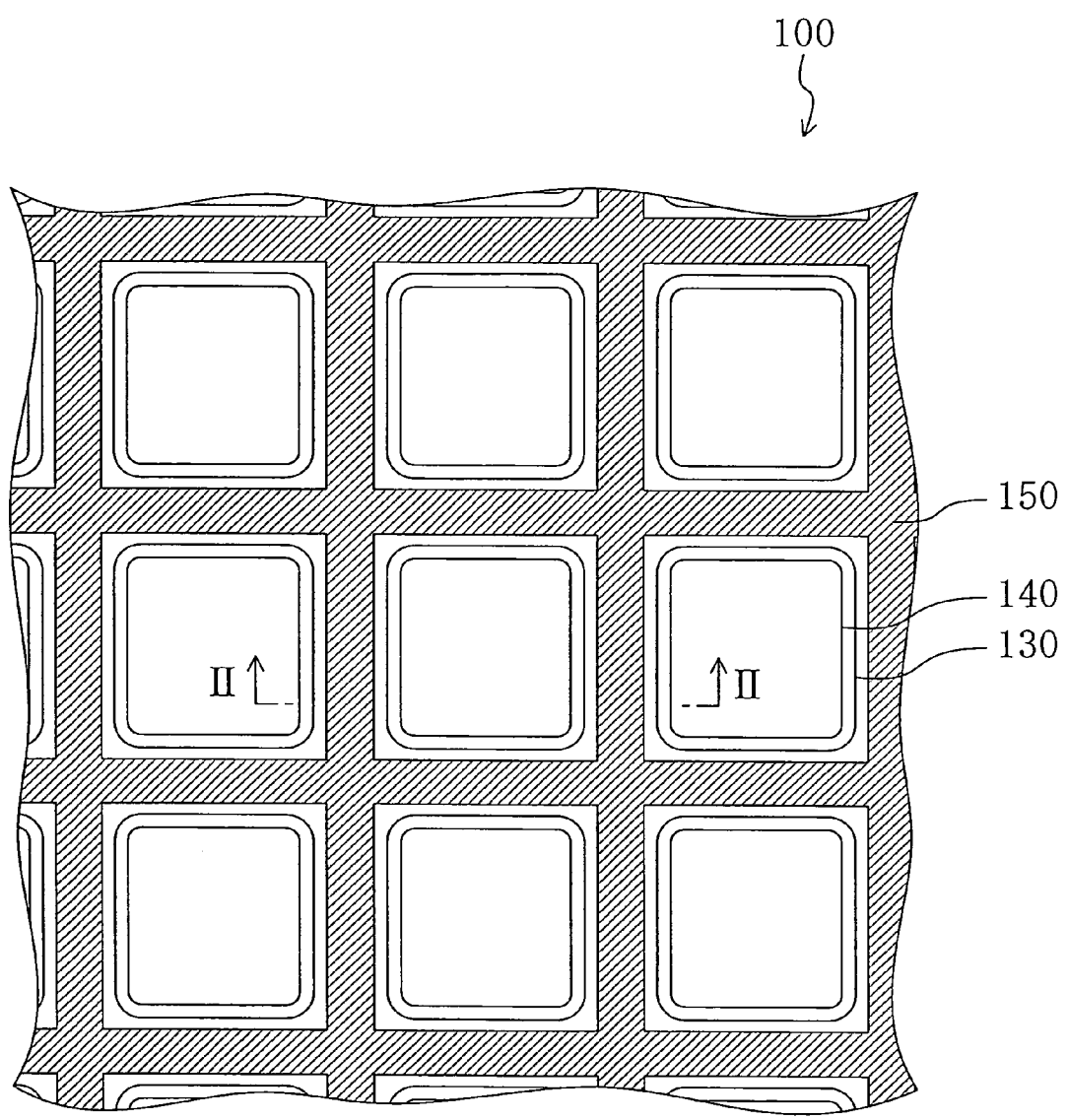
FIG. 1 is a schematic plan view illustrating an organic EL element 100 of Embodiment 1.

FIG. 1 is a schematic plan view illustrating an organic EL element 100 of Embodiment 1.

Figure 2:
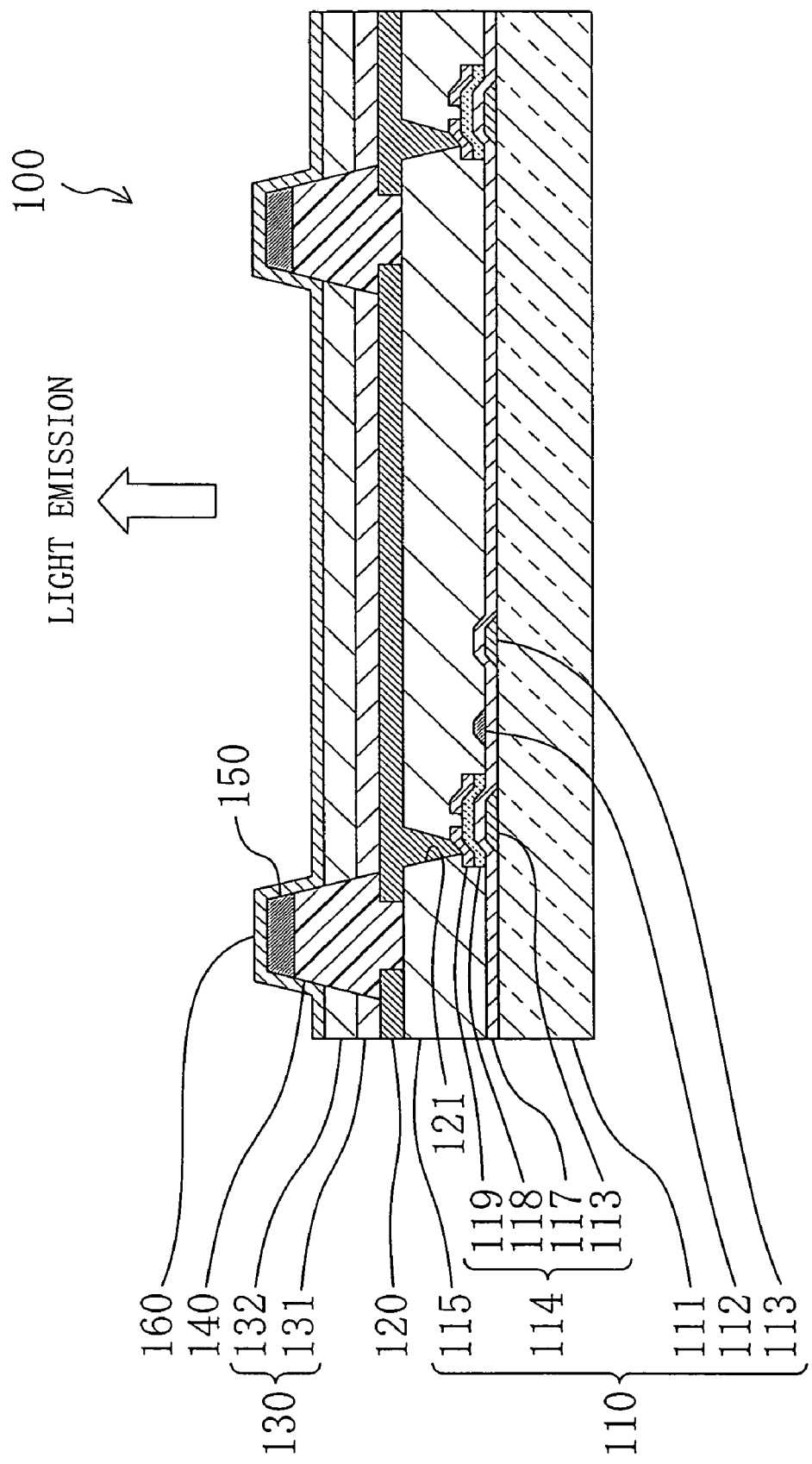
FIG. 2 is a schematic sectional view taken along the line II-II shown in FIG. 1.

FIG. 2 is a schematic sectional view taken along the line II-II shown in FIG. 1.

The organic EL element 100 includes a thin film transistor (TFT) substrate 110, a plurality of first electrodes 120 which are arranged on the TFT substrate 110 in a predetermined configuration (e.g., a matrix configuration), a wall-like insulating layer 140 which isolates the first electrodes 120 from each other, organic light emitting layers 130 formed on the first electrodes 120, respectively, an auxiliary electrode 150 formed on the wall-like insulating layer 140 and a second electrode 160 which is formed to cover the surfaces of the wall-like insulating layer 140, the auxiliary electrode 150 and the organic light emitting layers 130 and electrically connected to the auxiliary electrode 150. The second electrode 160 is transparent to light emitted from the organic light emitting layer 130. For the convenience' sake, the second electrode 160 is omitted from FIG. 1.

The TFT substrate 110 includes an insulating substrate 111, a plurality of TFTs 114 connected to the respective first electrodes 120 arranged in the predetermined configuration, source electrodes 112 and gate electrodes 113 which are electrically connected to the TFTs 114 and a planarization film 115 for planarizing one of the surfaces of the TFT substrate 110 above which the organic light emitting layers 130 are formed.

The insulating substrate 111 is preferably made of insulating material which ensures the mechanical strength of the organic EL element 100. For example, the insulating substrate 111 may be made of quartz, glass such as soda glass, inorganic material such as ceramic or organic material such as polyimide and polyester.

Each of the TFTs 114 is formed of a gate electrode 113, a gate insulating film 117 formed on the gate electrode 113, an island-shaped semiconductor 118 which is insulated from the gate electrode 113 by the gate insulating film 117 and a TFT electrode 119 which is formed to cover the peripheral portion of the island-shaped semiconductor 118 (bottom gate TFTs). In the present invention, the TFTs are not limited to bottom gate TFTs. For example, the TFTs may be top gate TFTs.

The first electrodes 120 are arranged on the TFT substrate 110 in a predetermined configuration (e.g., a matrix configuration). Each of the first electrodes 120 is connected to the TFT electrode 119 via a connection part (through hole) 121 formed in the planarization film 115. The first electrodes 120 implant holes into the organic light emitting layers 130 in response to signals input from the TFTs 114.

The first electrodes 120 are preferably arranged not to overlap the gate electrodes 113 or the source electrodes 112. If the first electrodes 120 overlap the source electrodes 112 or the gate electrodes 113, a high parasitic resistance is generated to deteriorate display quality.

Examples of material for the first electrodes 120 include metal material such as silver (Ag) and aluminum (Al) and conductive oxides such as indium tin oxide (ITO) and indium zinc oxide (IZO).

In order to implant the holes into the organic light emitting layers 130 with high efficiency, the first electrodes 120 are preferably made of material having a high work function such as indium tin oxide (ITO). Further, in the organic EL element 100, light emitted by the light emitting layers 130 is output through the second electrode 160. Therefore, it is preferred that the first electrodes 120 are light-reflective. That is, the first electrodes 120 are preferably made of light reflective material such as silver (Ag) or aluminum (Al).

Further, the first electrodes 120 may have a multilayer structure of a metal layer made of aluminum (Al) having high conductivity and high light reflectance and an electrode layer made of indium zinc oxide (IZO) having a high work function. By so doing, the first electrodes 120 are given with both high light reflectance and high hole implantation efficiency. This allows providing the organic EL element 100 with higher luminance.

Each of the first electrodes 120 in the organic EL element 100 of Embodiment 1 is rectangular. However, the shape of the first electrodes 120 may be varied (e.g., they may be round, oval or the like).

If the organic light emitting layers 130 are formed by a wet application process using an organic solvent such as ink jet printing or spin coating, the surfaces of the first electrodes 120 are preferably subjected to a UV/O$_3$ treatment to render the surfaces nonrepellent to the solvent (ink). By so doing, the first electrodes 120 improve in affinity for ink for forming the organic light emitting layers 130. Accordingly, the organic light emitting layers 130 are formed more uniformly. As a result, the organic EL element 100 is obtained with fewer defects.

The wall-like insulating layer 140 is grid-shaped when viewed in plan so that it isolates the first electrodes 120 arranged in the predetermined configuration (matrix configuration) from each other. The wall-like insulating layer 140 is preferably made of material which is less likely to become deformed or vary in property upon heating. The wall-like insulating layer 140 may be made of photosensitive polyimide, an acrylic resin, a methacrylate resin or a novolac resin.

Preferable material for the wall-like insulating layer 140 is a photosensitive resin because it allows patterning of the wall-like insulating layer 140 by photolithography. That is, the wall-like insulating layer 140 is patterned easily into the grid shape without etching or peeling.

If the organic light emitting layers 130 are formed by the wet application process (ink jet printing, spin coating or the like), the wall-like insulating layer 140 is preferably made of material which is repellent to an organic solvent (ink) (hereinafter this property is referred to as liquid repellency). By so doing, even when the organic light emitting layers 130 are formed by the wet application process, the ink used is prevented from adhering to the wall-like insulating layer 140. As a result, the organic light emitting layers 130 are formed uniformly.

Even if ink droplets are ejected with poor accuracy and reached a slanting part of the wall-like insulating layer 140, the droplets slide down along the slanting part of the wall-like insulating layer 140, whereby the ink is provided at a desired position. This allows obtaining the organic light emitting layers 130 with fewer irregularities. The liquid-repellant wall-like insulating layer 140 may be made of organic material such as polyimide or an acrylic resin doped with a fluorine or silicon-based additive.

The liquid repellency may be added to the wall-like insulating layer 140 after the formation thereof. For example, the liquid repellency may be added thereto by a treatment with oxygen plasma or tetrafluorocarbon plasma.

The organic light emitting layers 130 are formed on the first electrodes 120 which are isolated by the grid-shaped wall-like insulating layer 140 from each other. Each of the organic light emitting layers 130 includes a hole transport layer 131 and a light emitting layer 132. However, the present invention is not limited thereto. The organic light emitting layer 130 may be formed of the light emitting layer 132 only. Or alternatively, the organic light emitting layer 130 may be formed of the light emitting layer 132 and one or more layers of a hole implantation layer, the hole transport layer 131, an electron transport layer and an electron implantation layer.

The hole transport layer 131 transports holes implanted from the first electrode 120 to the light emitting layer 132. The hole transport layer 131 preferably has high hole transport efficiency. Examples of suitable material for forming the hole transport layer 131 of high transport efficiency include low molecular materials such as a porphyrin compound, an aromatic tertiary amine compound, a hydrazone compound, a quinacridon compound and a stilamine compound. More specifically, examples of the aromatic tertiary amine compound include N,N'-bis-(3-methylphenyl)-N,N'-bis-(phenyl)-benzidine (TPD) and N,N'-di(naphthalene-1-il)-N,N'-diphenyl-benzidine (NPD).

Examples of high molecular material suitable for forming the hole transport layer 131 include polyaniline, 3,4-polyethylenedioxythiophene/polystyrenesulphonate (PEDT/PSS), poly(triphenylamine) derivatives and polyvinylcarbazole (PVCz). Further, examples of precursors of high molecular material suitable for forming the hole transport layer 131 include a poly(p-phenylene vinylene) precursor and a poly(p-naphthalene vinylene) precursor.

The hole transport layer 131 is not limited to a single-layered one and may have a multilayer structure. Further, a hole implantation layer may be provided between the hole transport layer 131 and the light emitting layer 132. With the hole implantation layer interposed therebetween, hole implantation to the light emitting layer 132 is performed with improved efficiency. This allows providing the organic EL element 100 with higher luminance.

Holes implanted from the first electrode 120 and electrons implanted from the second electrode 160 are recombined in the light emitting layer 132 to generate excitons in the light emitting layer 132. When the excitons are deactivated to enter the ground state, light is emitted from the light emitting layer 132.

The light emitting layer 132 may contain low molecular light emitting material or high molecular light emitting material. The light emitting layer 132 containing the low molecular light emitting material may be formed by vacuum deposition. On the other hand, the light emitting layer 132 containing the high molecular light emitting material may be formed by the wet application process such as inkjet printing or spin coating. According to the wet application process, the organic EL element 100 including the high-definition, large-area TFT substrate 110 is manufactured by fewer steps at low costs.

Examples of material for the light emitting layer 132 include: poly(2-decyloxy-1,4-phenylene) (DO-PPP); poly[2,5-bis-[2-(N,N,N-triethylammonium) ethoxy]-1,4-phenyl-alto-1,4-phenylene]dibromide (PPP-Net$^{3+}$); and poly[2-(2'-ethylhexyloxy)-5-methoxy-1,4-phenylenevinylene] (MEH-PPV).

The second electrode 160 is formed as a layer which covers the surfaces of the auxiliary electrode 150, the organic light emitting layers 130 and the wall-like insulating layer 140. The second electrode 160 implants electrons into the organic light emitting layers 130. The second electrode 160 preferably has high light transmittance so that light from the light emitting layer 132 is passed therethrough. The second electrode 160 may suitably be made of indium tin oxide (ITO) or indium zinc oxide (IZO).

To improve efficiency in implanting electrons into the organic light emitting layers 130, the second electrode 160 is preferably made of material having a low work function. Examples of such material include calcium (Ca) and aluminum (Al). The second electrode 160 may have a layered structure of a metal layer made of calcium (Ca) or aluminum (Al) having a low work function and a transparent electrode layer made of indium tin oxide (ITO) or the like having high light transmittance. By so doing, the second electrode 160 is given with both high electron implantation efficiency and high light transmittance. This allows providing the organic EL element 100 with higher luminance.

The second electrode 160 may be made of an ultra-thin film made of metal or the like.

In Embodiment 1, the second electrode 160 is formed as a single layer covering the surfaces of the organic light emitting layers 130, but the second electrode 160 may be divided into two or more electrode layers.

The second electrode 160 is electrically connected to the auxiliary electrode 150 formed below the second electrode 160. Since the auxiliary electrode 150 is lower than the second electrode 160 in electric resistance, the auxiliary electrode 150 reduces the surface resistance of the second electrode 160. Therefore, the occurrence of unevenness in image display, which is caused by a drop in voltage in the second electrode 160, is prevented effectively, whereby uniform image display is realized by the organic EL element 100. Further, since the auxiliary electrode 150 reduces the surface resistance of the second electrode 160, the organic EL element 100 can be driven at a low voltage.

The auxiliary electrode 150 may be made of low resistance metal material. Examples of such material include copper (Cu), tantalum (Ta), titanium (Ti), chromium (Cr), aluminum (Al) and silver (Ag).

As shown in FIG. 1, the auxiliary electrode 150 of Embodiment 1 is formed on the entire wall-like insulating layer 140 having a grid-like plane configuration. However, the present invention is not limited thereto.

Figure 3:
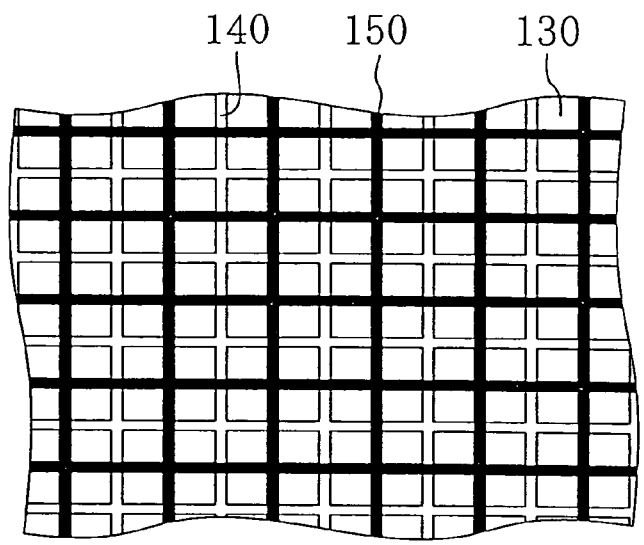
FIG. 3 is a schematic plan view illustrating an example of the arrangement of an auxiliary electrode 150.
Figure 4:
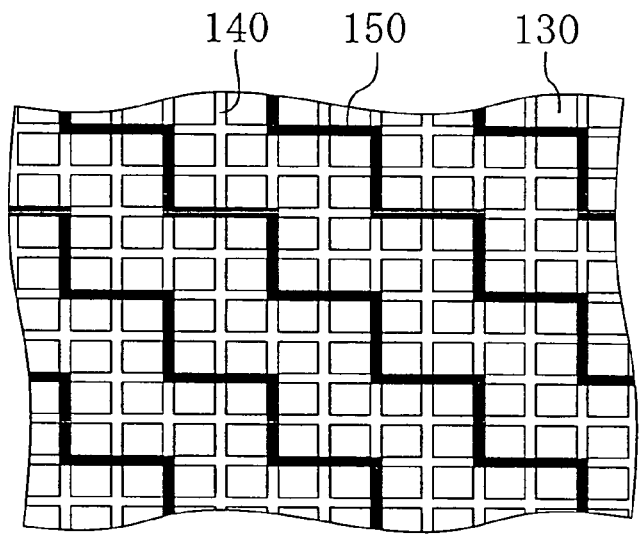
FIG. 4 is a schematic plan view illustrating an example of the arrangement of the auxiliary electrode 150.
Figure 5:
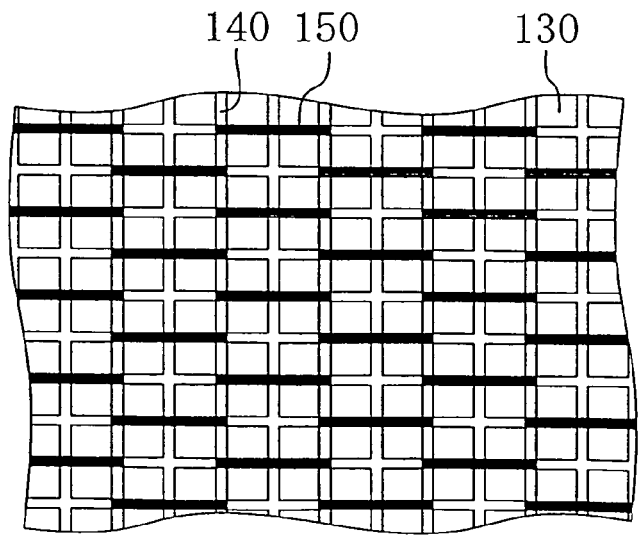
FIG. 5 is a schematic plan view illustrating an example of the arrangement of the auxiliary electrode 150.

FIGS. 3 to 5 are schematic plan views illustrating how the auxiliary electrode 150 is formed.

As shown in FIGS. 3 to 5, the auxiliary electrode 150 may be formed on top of part of the wall-like insulating layer 140. For example, as shown in FIG. 5, the auxiliary electrode 150 may be divided into multiple fragmentary electrodes. Any of the arrangements shown in FIGS. 3 to 5 allows reduction in surface resistance of the second electrode 160. Therefore, a drop in voltage in the second electrode 160 is prevented from occurring.

When the auxiliary electrode 150 is formed on top of part of the wall-like insulating layer 140, the other part of the wall-like insulating layer 140 on top of which the auxiliary electrode 150 is not formed may be smaller in width than the part thereof on top of which the auxiliary electrode 150 is formed. That is, the part of the wall-like insulating layer 140 on top of which the auxiliary electrode 150 is formed may be wider than the part thereof on top of which the auxiliary electrode 150 is not formed. By so doing, the area ratio of the wall-like insulating layer 140 to the display region, i.e., the area ratio of a non-emission region, is reduced. As a result, the organic EL element 100 is provided with higher luminance and higher aperture ratio.

The part of the wall-like insulating layer 140 on top of which the auxiliary electrode 150 is formed are preferably about twice or more wider than the other part of the wall-like insulating layer 140. In the formation of the organic light emitting layers 130, the wall-like insulating layer 140 prevents the mixing of the organic light emitting layers 130. For example, when the organic light emitting layers 130 are formed by ink jet printing, the width of the grid lines forming the wall-like insulating layer 140 is minimized to such a degree that even if the ink droplet is misaligned with the intended position, the ink droplet does not reach the adjacent organic light emitting layer 130. Therefore, the part of the wall-like insulating layer 140 on top of which the auxiliary electrode 150 is formed is designed to have a width twice or more larger than the minimum width. By so doing, the auxiliary electrode 150 formed on the wall-like insulating layer 140 is prevented from being covered with the misaligned ink droplet. Thus, the organic EL element 100 is easily obtained while the auxiliary electrode 150 is electrically connected to the second electrode 160 with reliability.

Where the organic EL element 100 is a full-color organic EL element including subpixels for emitting red (R) light, green (G) light and blue (B) light, the auxiliary electrode 150 may be formed only on some of the grid lines of the wall-like insulating layer 140 which define pixels, each including a set of a subpixel for emitting red light, a subpixel for emitting green light and a subpixel for emitting blue light, from each other.

In the present specification, the pixel includes two or more subpixels. The pixel is not limited to the one including three subpixels for emitting lights of different colors. The two or more subpixels for a single pixel may emit lights of the same color. Or alternatively, the two or more subpixels for a single pixel may emit lights of different colors. For example, a single pixel may include four subpixels for emitting lights of red (R), green (G), blue (B) and white (W), respectively. The subpixels are formed of the organic light emitting layers 130, respectively.

Figure 6:
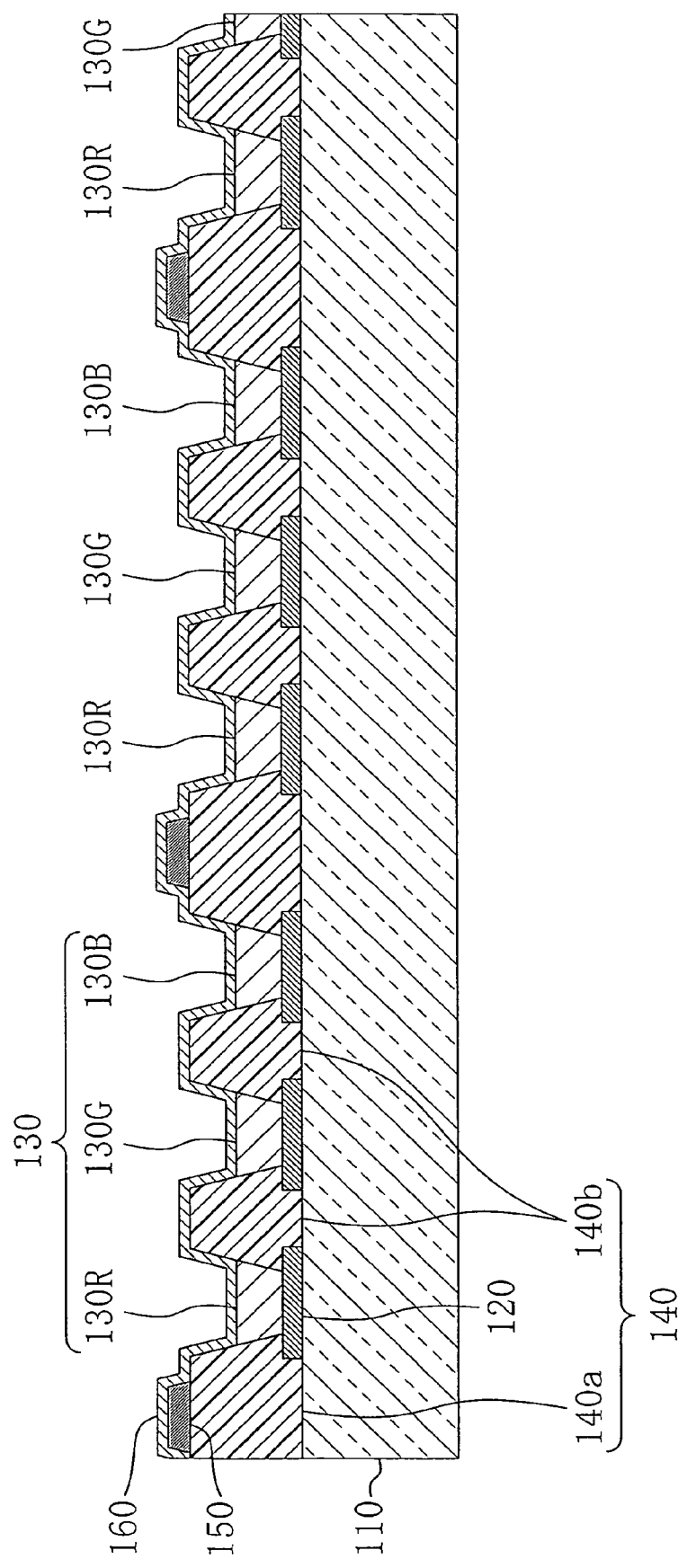
FIG. 6 is a schematic sectional view of the organic EL element 100 in which the auxiliary electrode 150 is formed on part of a wall-like insulating layer 140 which defines pixels from each other.

FIG. 6 is a schematic sectional view of the organic EL element 100 in which the auxiliary electrode 150 is formed on the some of the grid lines of the wall-like insulating layer 140 which define the pixels from each other.

Referring to FIG. 6, each of the pixels includes an organic light emitting layer 130R for emitting red light, an organic light emitting layer 130G for emitting green light and an organic light emitting layer 130B for emitting blue light. The auxiliary electrode 150 is formed only on the some of the grid lines of the wall-like insulating layer 140 which define the pixels from each other, i.e., on the grid lines 140a of the wall-like insulating layer 140, each of which is positioned between the organic light emitting layer 130R and the organic light emitting layer 130B. On the other hand, the auxiliary electrode 150 is not formed on the grid lines 140b of the wall-like insulating layer 140, each of which is positioned between the organic light emitting layer 130R and the organic light emitting layer 130G, and the grid lines 140b of the wall-like insulating layer 140, each of which is positioned between the organic light emitting layer 130G and the organic light emitting layer 130B. If the auxiliary electrode 150 is formed on every grid line of the wall-like insulating layer 140, limitations are often imposed by the manufacturing process and every grid line of the wall-like insulating layer 140 must have a larger width as compared with the case where the auxiliary electrode 150 is formed on some of the grid lines. This may lead to a decrease in light emitting area par pixel. However, according to the structure of this embodiment, the decrease in light emitting area par pixel is minimized as possible. Therefore, the resulting organic EL element 100 is provided with higher luminance. The structure shown in FIG. 6 is also effective in reducing the surface resistance of the second electrode 160.

The auxiliary electrode 150 may be formed on some of the grid lines of the wall-like insulating layer 140 which are adjacent to the light emitting layers 130 having the smallest light emitting area. More specifically, the auxiliary electrode 150 may be formed on some of the grid lines of the wall-like insulating layer 140 positioned between the organic light emitting layers 130G and the organic light emitting layers 130R. In consideration of mutual relationship among light emission efficiency, chromaticity and life, the organic light emitting layers 130G are given with the smallest light emitting area, while the organic light emitting layer 130R are given with the second smallest area.

Figure 7:
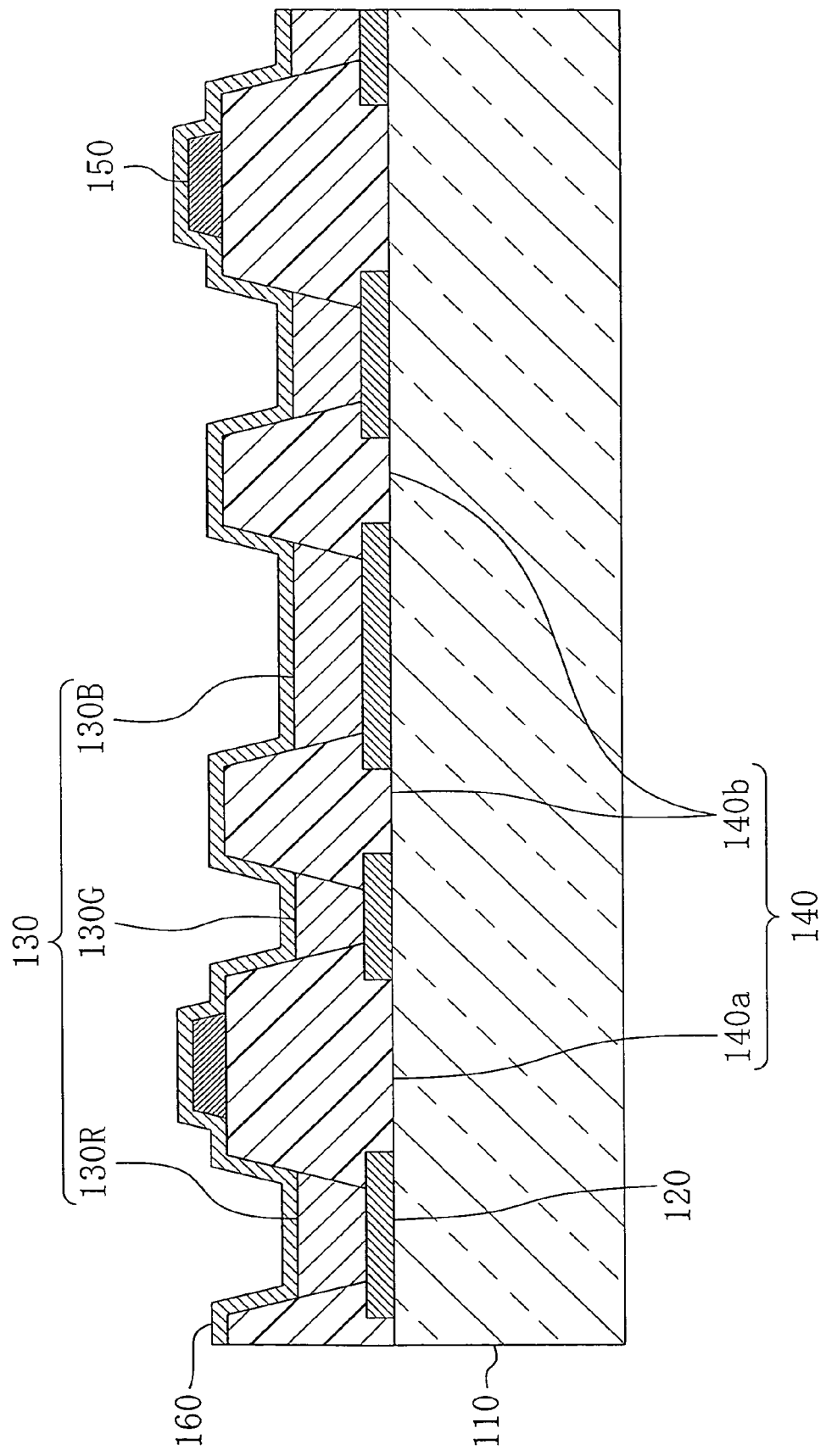
FIG. 7 is a schematic sectional view of the organic EL element 100 in which the auxiliary electrode 150 is formed on part 140a of the wall-like insulating layer 140 positioned between an organic light emitting layer 130G and an organic light emitting layer 130R.

FIG. 7 is a schematic sectional view of the organic EL element 100 in which the auxiliary electrode 150 is formed on the grid lines 140a of the wall-like insulating layer 140, each of which is positioned between the organic light emitting layer 130G and the organic light emitting layer 130R.

In general, material for emitting green light shows the highest luminance, while material for emitting red light shows the lowest luminance. The luminance of material for emitting blue light lies between that of the material for emitting green light and that of the material for emitting red light. Therefore, if the organic EL element includes the organic light emitting layers 130R containing the material for red light emission, the organic light emitting layers 130G for green light emission and the organic light emitting layers 130B for blue light emission, and the organic light emitting layers 130R, 130G and 130B have the same light emitting area, electric current applied to the organic light emitting layers 130R needs to be higher than those applied to the organic light emitting layers 130G and 130B to equalize the luminance of the organic light emitting layers 130R, 130G and 130B. However, since the luminance of the organic light emitting layers 130B is attenuated at the highest rate, color balance is varied over time and color drift occurs in a displayed image.

Thus, if the organic light emitting layers 130B are given with the largest light emitting area and the organic light emitting layers 130G are given with the smallest light emitting area, the deterioration of the organic light emitting layers 130B is slowed relative to the organic light emitting layers 130R and 130G. That is, the luminance attenuation rates of the organic light emitting layers 130R, 130G and 130B are substantially equalized. As a result, color balance of a displayed image is less likely to vary over time and the organic EL element 100 is provided with long life.

In each pixel, if the organic light emitting layer 130B is given with the largest light emitting area and the organic light emitting layer 130G is given with the smallest light emitting area, a non-emission region between the organic light emitting layer 130G of the smallest area and the organic light emitting layer 130R may become relatively wide due to limitations on design of the TFT substrate 110. Therefore, if the wall-like insulating layer 140 is formed in the wide non-emission region between the organic light emitting layers 130G and 130R and the auxiliary electrode 150 is formed thereon, the aperture ratio is hardly sacrificed by the formation of the auxiliary electrode 150. Thus, with the above-described configuration, the organic EL element 100 is provided with high luminance, long life and high aperture ratio, while color balance of a displayed image is less likely to vary over time.

Hereinafter, an explanation is given of a method for manufacturing the organic EL element 100.

Figure 8:
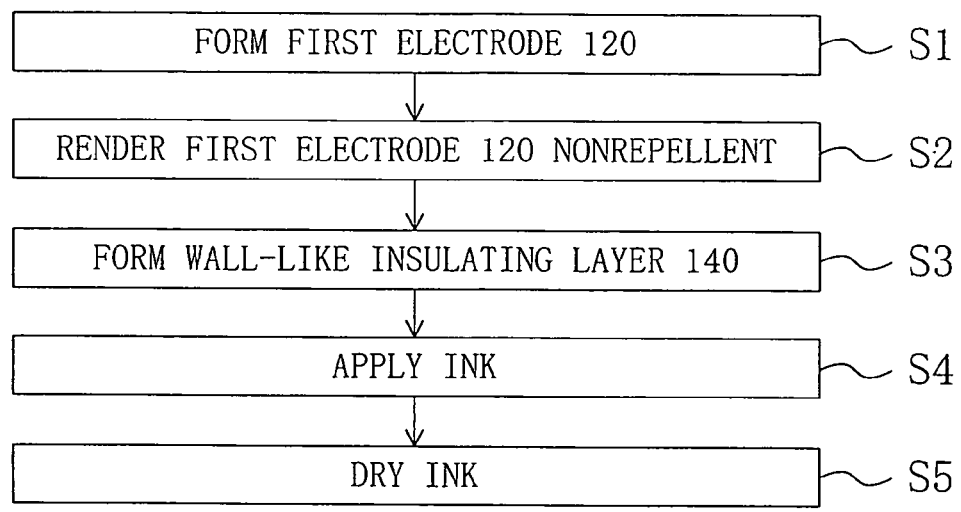
FIG. 8 is a flowchart illustrating some of the steps of manufacturing the organic EL element 100.

FIG. 8 is a flowchart illustrating some of the steps of manufacturing the organic EL element 100.

First, a source electrodes 112, gate electrodes 113, TFTs 114 and planarization film 115 are formed on an insulating substrate 111. There are no particular limitations on methods for forming and patterning the source electrodes 112, gate electrodes 113, TFTs 114 and planarization film 115. On the planarization film 115, a film of conductive material such as aluminum (Al) is formed by sputtering. The thus formed conductive film is patterned into a desired shape to obtain first electrodes 120 (S1). If organic light emitting layers 130 are formed by a wet application process (inkjet printing, spin coating or the like) in a later step, the surfaces of the first electrodes 120 are subjected to a $UV/O_3$ treatment to give them an affinity for liquid (to render the surfaces nonrepellent to an organic solvent used for inkjet printing) (S2). Rendering the surfaces of the first electrodes 120 nonrepellent to liquid, an affinity between the first electrodes 120 and the organic light emitting layers 130 improves. As a result, the organic light emitting layers 130 are formed more uniformly. Thus, an organic EL element 100 is obtained with fewer defects.

On the TFT substrate 110 provided with the first electrodes 120, a wall-like insulating layer 140 is formed (S3). For example, the wall-like insulating layer 140 may be formed by the following method. First, a thin film of photosensitive polyimide or the like is formed by spin coating. Then, the obtained thin polyimide film is patterned into a desired shape by a photoresist process including photoresist application, pre-baking, light exposure, development, post-baking, etching and photoresist peeling. Thus, the wall-like insulating layer 140 is obtained. If the organic light emitting layers 130 are formed by the wet application process using an organic solvent such as inkjet printing or spin coating in a later step, the wall-like insulating layer 140 is preferably made of liquid-repellant material doped with a fluorine or silicon-based additive. Instead of forming the wall-like insulating layer 140 using the liquid-repellent material, the surface of the wall-like insulating layer 140 may be subjected to such a treatment that gives liquid repellency (a property of rejecting liquid (ink) containing material for forming the organic light emitting layers 130). The treatment for giving liquid repellency may be performed using oxygen plasma or tetrafluorocarbon plasma. Giving liquid repellency to the surface of the wall-like insulating layer 140 effectively prevents ink droplets containing the material for forming the organic light emitting layers 130 from misalignment with the intended positions.

Then, an auxiliary electrode 150 is formed on the wall-like insulating layer 140. The auxiliary electrode 150 may be formed by sputtering, for example. On each of the first electrodes 120 isolated into a matrix configuration by the wall-like insulating layer 140, a hole transport layer 131 and a light emitting layer 132 are formed by the wet application process (inkjet printing, spin coating or the like) to obtain the organic light emitting layer 130. By employing the wet application process such as inkjet printing or spin coating, the organic light emitting layers 130 are formed at low costs by relatively few manufacturing steps.

Where the wet application process is employed to form the organic light emitting layers 130, ink containing the material for forming the organic light emitting layers 130 is applied (S4) and the applied ink is dried (S5). Hereinafter, the steps of forming the organic light emitting layers 130 are explained in detail. First, ink containing material for forming the hole transport layers 131 is applied onto the first electrodes 120 (S4). Then, the applied ink is dried to obtain the hole transport layers 131 (S5). Subsequently, ink containing material for the light emitting layers 132 is applied to the hole transport layers 131 (S4) and the applied ink is dried to obtain the light emitting layers 132 (S5).

A second electrode 160 is formed to cover the surfaces of the organic light emitting layers 130. The second electrode 160 may be formed by sputtering.

Figure 9:
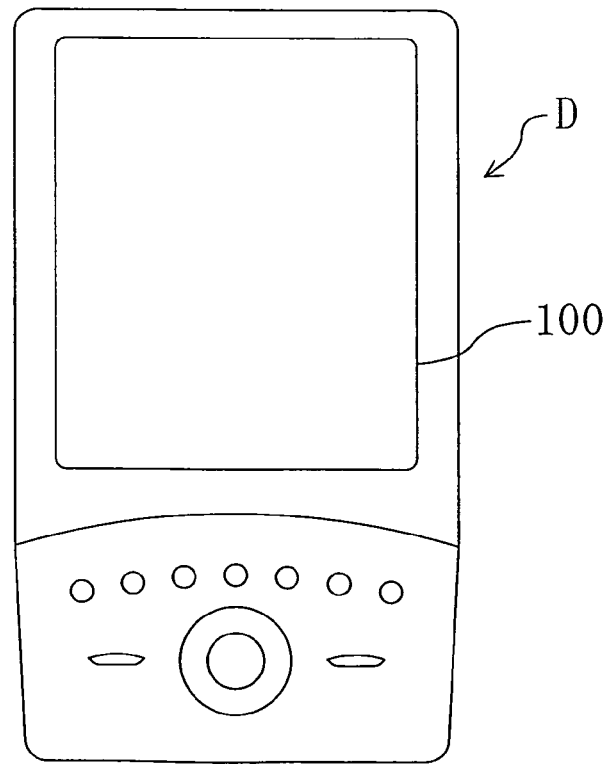
FIG. 9 is a schematic diagram of an organic EL display device D including the organic EL element 100.

FIG. 9 is a schematic diagram of an organic EL display device D including the organic EL element 100.

As described above, the organic EL element 100 allows image display with high luminance and reduced variations in luminance and is manufactured by fewer manufacturing steps at low costs. Therefore, the organic EL display device D including the organic EL element 100 is also capable of displaying images with high luminance and reduced variations in luminance and manufactured by fewer manufacturing steps at low costs.

Embodiment 2

An organic EL element 200 of Embodiment 2 is substantially the same as the organic EL element 100 of Embodiment 1 except where to provide the auxiliary electrode and the structure of the pixels. Now, with reference to the drawings, a detailed explanation is given of where to provide the auxiliary electrode and the structure of pixels P in the organic EL element 200 of Embodiment 2.

Figure 10:
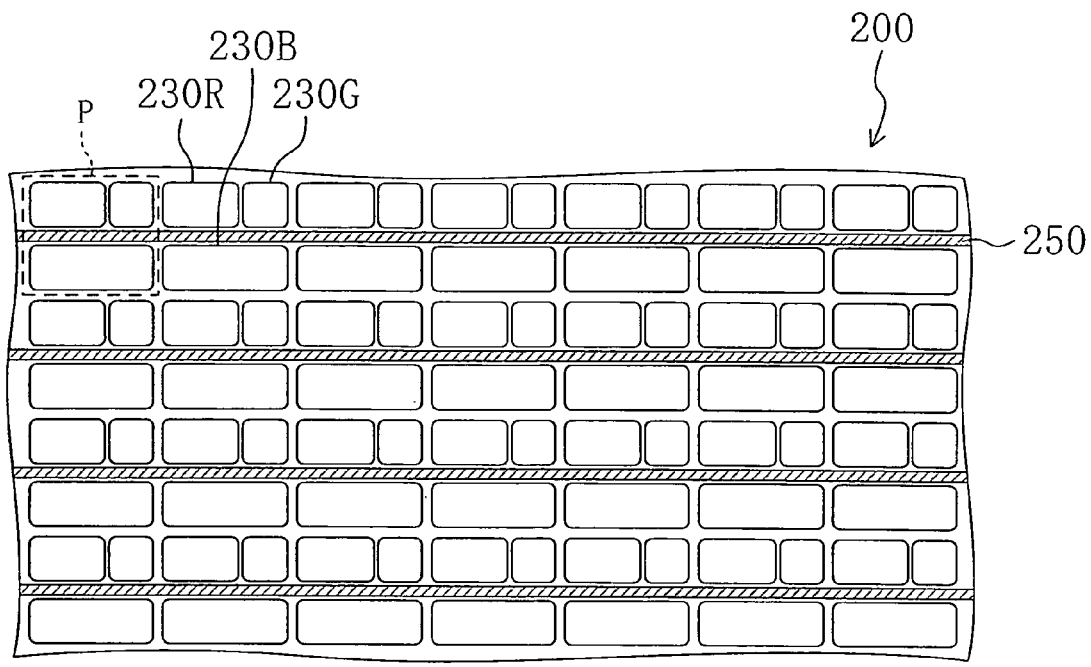
FIG. 10 is a plan view illustrating an organic EL element 200 of Embodiment 2.

FIG. 10 is a plan view illustrating the organic EL element 200 of Embodiment 2.

The organic EL element 200 includes organic light emitting layers 230B for emitting blue (B) light, organic light emitting layers 230R for emitting red (R) light and organic light emitting layers 230G for emitting green (G) light. Among the organic light emitting layers 230B, 230R and 230G, the organic light emitting layers 230B have the largest light emitting area, while the organic light emitting layers 230G have the smallest light emitting area. The light emitting area of the organic light emitting layers 230R is smaller than that of the organic light emitting layers 230B and larger than that of organic light emitting layers 230G. For example, in consideration of properties of light emitting materials of different colors, the light emitting areas $S_G$, $S_R$ and $S_B$ of the organic light emitting layers 230G, 230R and 230B may be adjusted to show the ratio of $S_G:S_R:S_B=1:2:10$.

In general, as described above, green light emitting material shows the highest light emission efficiency and red light emitting material shows the lowest luminance. Further, the luminance of the organic light emitting layers 230B is attenuated at the highest rate. Therefore, color balance is varied over time, causing color drift in a displayed image.

In the organic EL element 200 of Embodiment 2, the light emitting areas of the organic light emitting layers 230B, 230R and 230G are varied in consideration of the differences in duration of light emission of the organic light emitting layers 230B, 230R and 230G (luminance attenuation rate) and light emission efficiency. Therefore, the organic EL element 200 is provided with long life while variations in color balance over time are reduced. In particular, in view of the properties of the R, G, B light emitting materials, it is preferable that the organic light emitting layers 230B are given with the largest light emitting area and the organic light emitting layers 230G are given with the smallest light emitting area.

The organic EL element 200 includes pixels P, each of which includes an organic light emitting layer 230B, an organic light emitting layer 230R and an organic light emitting layer 230G. In each pixel P, the organic light emitting layer 230B is adjacent to the organic light emitting layers 230R and 230G, while the organic light emitting layer 230G is adjacent to the organic light emitting layers 230R and 230B. In other words, the organic light emitting layers 230B, 230R and 230G are arranged in an almost delta configuration. In the present specification, the "almost delta configuration" indicates that three light emitting regions in a single pixel are so arranged that the centers of gravity thereof form a triangle.

In the organic EL element 200 shown in FIG. 10, due to limitations on the design of the TFT substrate (especially, the positions of through holes), a relatively wide space may be generated in the vicinity of the organic light emitting layer 230G having the smallest light emitting area. More specifically, the relatively wide space may be generated between the organic light emitting layer 230B and the organic light emitting layers 230R and 230G. In this embodiment, part of the wall-like insulating layer 140 present at the wide space in the pixels is given with a relatively larger width than the other part. Further, an auxiliary electrode 250 is formed on the relatively wider part of the wall-like insulating layer 140. By so doing, the aperture ratio is hardly reduced by the formation of the auxiliary electrode 250. Thus, the organic EL element 200 is provided with high luminance and reduced variations in luminance.

Embodiment 3

An organic EL element 300 of Embodiment 3 is substantially the same as the organic EL element 100 of Embodiment 1 except where to provide the auxiliary electrode and the structure of the pixels. Now, with reference to the drawings, a detailed explanation is given of where to provide the auxiliary electrode and the structure of pixels P in the organic EL element 300 of Embodiment 3.

Figure 11:
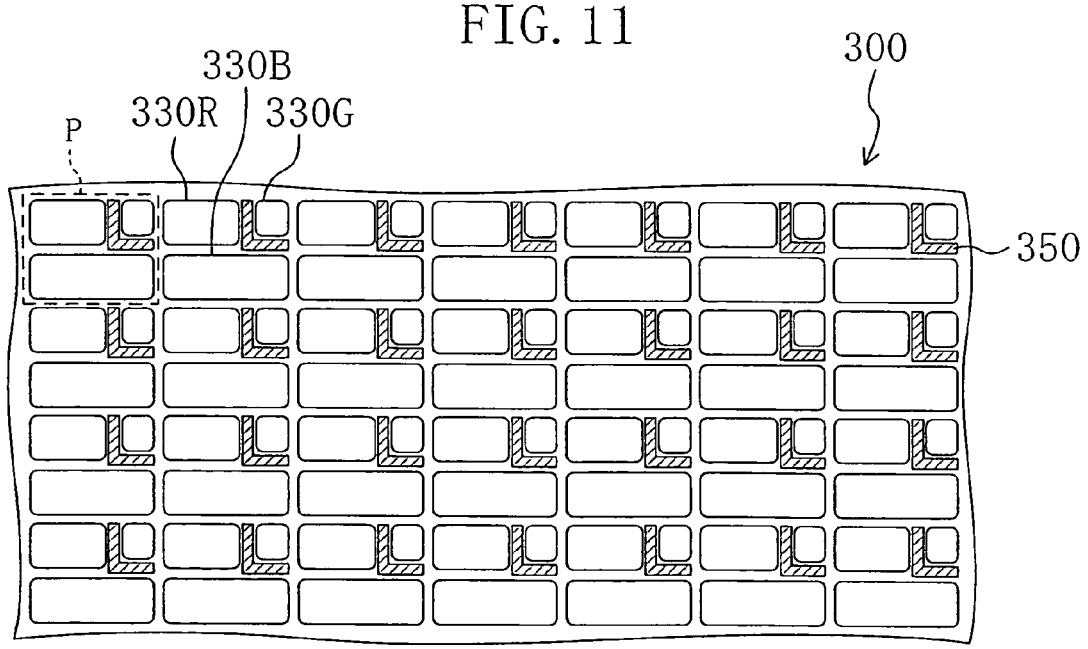
FIG. 11 is a plan view illustrating an organic EL element 300 of Embodiment 3.

FIG. 11 is a plan view illustrating the organic EL element 300 of Embodiment 3.

The organic EL element 300 includes organic light emitting layers 330B for emitting blue light, organic light emitting layers 330R for emitting red light and organic light emitting layers 330G for emitting green light. Among the organic light emitting layers 330B, 330R and 330G, the organic light emitting layers 330B have the largest light emitting area, while the organic light emitting layers 330G have the smallest light emitting area. The light emitting area of the organic light emitting layers 330R is smaller than that of the organic light emitting layers 330B and larger than that of organic light emitting layers 330G. Therefore, the organic EL element 300 of Embodiment 3 does not show significant variations in color balance over time and offers long life.

The organic EL element 300 includes pixels P, each of which includes an organic light emitting layer 330B, an organic light emitting layer 330R and an organic light emitting layer 330G. In each pixel P, the organic light emitting layers 330B, 330R and 330G are arranged in the almost delta configuration.

In the organic EL element 300 shown in FIG. 11, due to limitations on the design of the TFT substrate (especially, the positions of through holes), a relatively wide space may be generated in the vicinity of the organic light emitting layer 330G having the smallest light emitting area. In this embodiment, an auxiliary electrode 350 is formed in space between the organic light emitting layers 330G and 330R and between the organic light emitting layers 330G and 330B. By so doing, the aperture ratio is hardly reduced by the formation of the auxiliary electrode 350. Thus, the organic EL element 300 is provided with high luminance and reduced variations in luminance.

In Embodiment 3, the auxiliary electrode 350 is divided into multiple electrodes formed one by one in every pixel P. Also in this case, the surface resistance of the second electrode (shared upper electrode) is effectively reduced.

Embodiment 4

An organic EL element 400 of Embodiment 4 is substantially the same as the organic EL element 1 of Embodiment 1 except where to provide the auxiliary electrode and the structure of the pixels. Now, with reference to the drawings, a detailed explanation is given of where to provide the auxiliary electrode and the structure of pixels in the organic EL element 400 of Embodiment 3.

Figure 12:
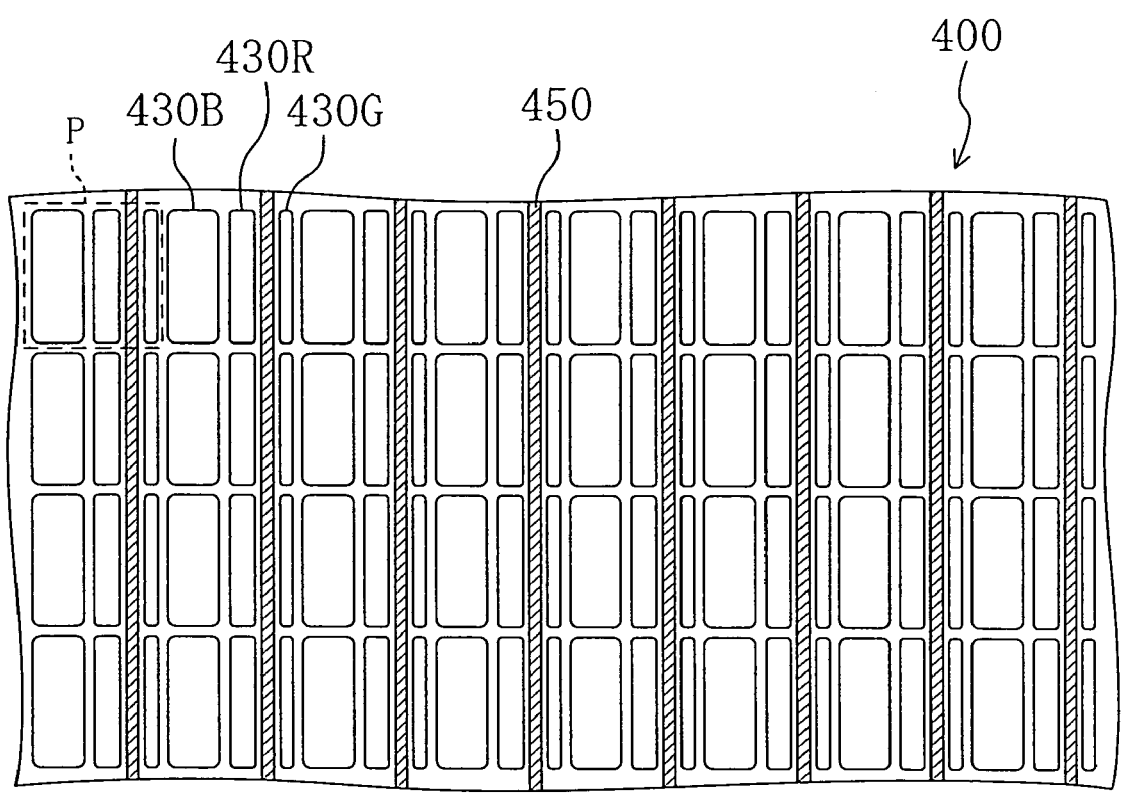
FIG. 12 is a plan view illustrating an organic EL element 400 of Embodiment 4.

FIG. 12 is a plan view illustrating the organic EL element 400 of Embodiment 3.

The organic EL element 400 includes organic light emitting layers 430B for emitting blue light, organic light emitting layers 430R for emitting red light and organic light emitting layers 430G for emitting green light. Among the organic light emitting layers 430B, 430R and 430G, the organic light emitting layers 430B have the largest light emitting area, while the organic light emitting layers 430G have the smallest light emitting area. The light emitting area of the organic light emitting layers 430R is smaller than that of the organic light emitting layers 430B and larger than that of organic light emitting layers 430G. Therefore, the organic EL element 400 of Embodiment 3 does not show significant variations in color balance over time and offers long life.

The organic EL element 400 includes pixels P, each of which includes an organic light emitting layer 430B, an organic light emitting layer 430R and an organic light emitting layer 430G. In each pixel P, the organic light emitting layers 430B, 430R and 430G are arranged in a stripe configuration. More specifically, the organic light emitting layers 430B, 430R and 430G, each of which is in the form of an elongated rectangle, are arranged parallel to each other.

In the organic EL element 400 shown in FIG. 12, due to limitations on the design of the TFT substrate (especially, the positions of through holes), a relatively wide space may be generated in the vicinity of the organic light emitting layer 430G having the smallest light emitting area. More specifically, the relatively wide space may be generated between the organic light emitting layer 430G and the organic light emitting layer 430R. In this embodiment, some of the grid lines of the wall-like insulating layer 140 positioned at the wide space are given with a relatively larger width than the other grid lines. Further, an auxiliary electrode 450 is formed on the relatively wider part of the wall-like insulating layer 140. By so doing, the aperture ratio is hardly reduced by the formation of the auxiliary electrode 450. Thus, the organic EL element 400 is provided with high luminance and reduced variations in luminance.

Thus, the variations of the auxiliary electrode arrangement are described in Embodiments 1 to 4. However, the variations are merely examples and the present invention is not limited thereto.

Embodiment 5

Figure 13:
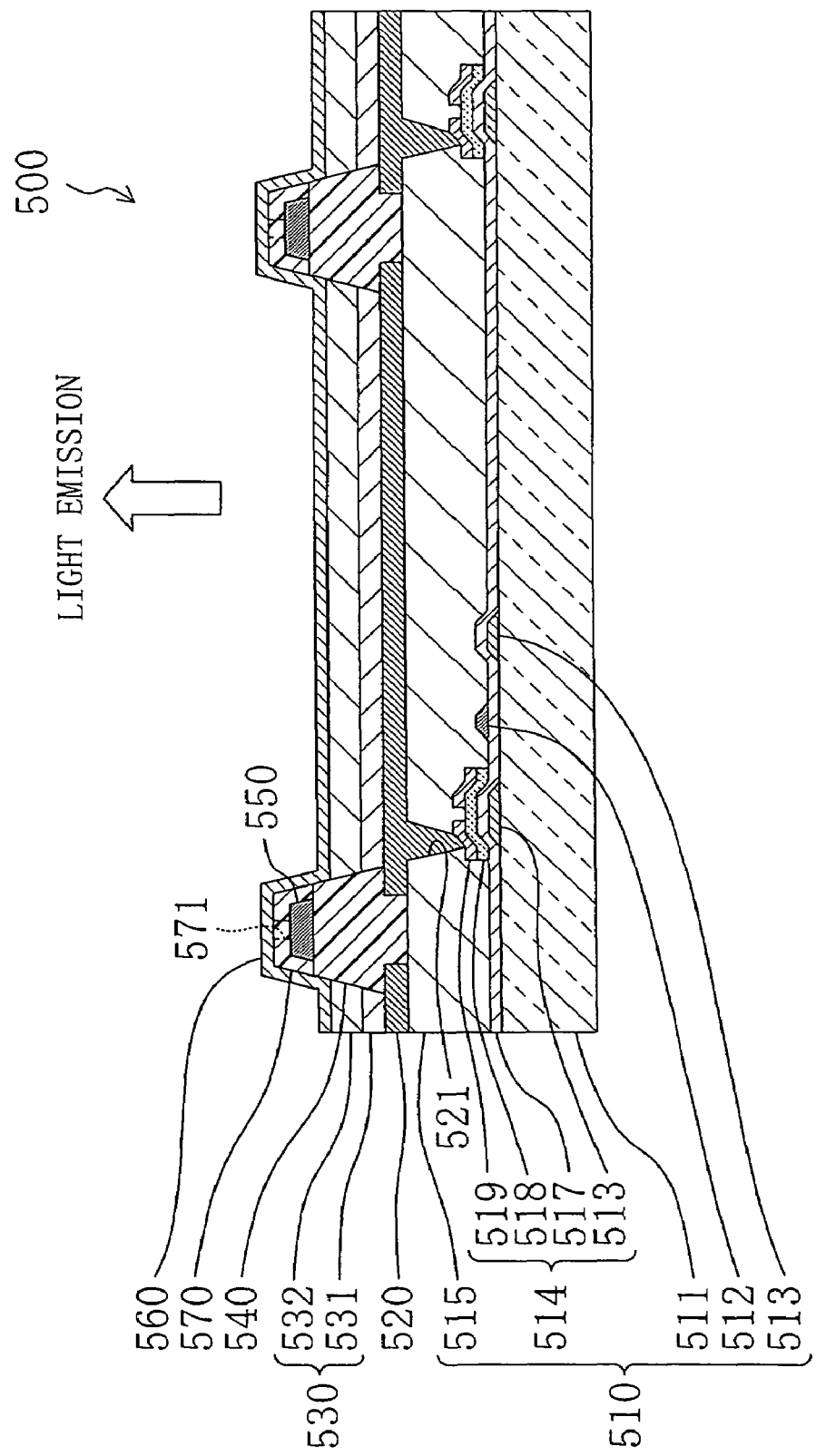
FIG. 13 is a schematic sectional view of an organic EL element 500 of Embodiment 5.
Figure 14:
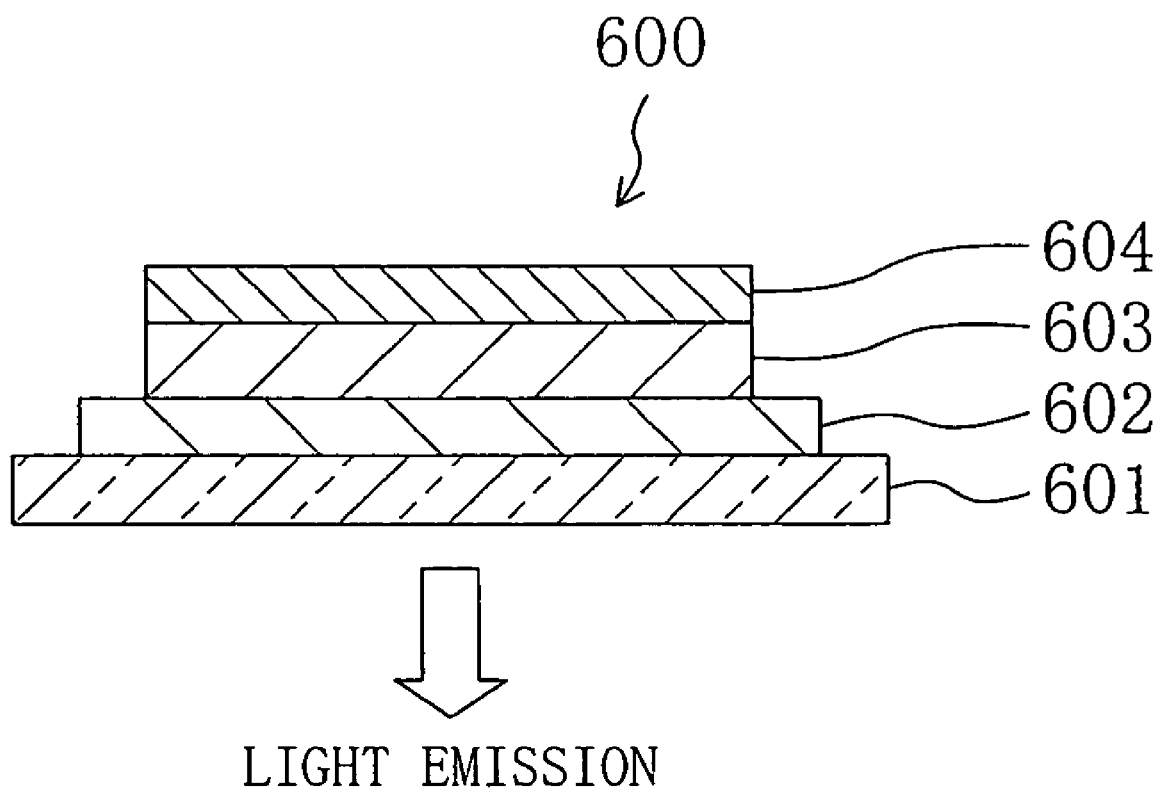
FIG. 14 is a schematic sectional view of a conventional organic EL element 600.

FIG. 13 is a schematic sectional view of an organic EL element 500 of Embodiment 5.

The organic EL element 500 of Embodiment 5 is substantially the same as the organic EL element 100 of Embodiment 1 except that a liquid repellent layer is further provided between the auxiliary electrode 150 and the second electrode 160.

More specifically, the organic EL element 500 includes a TFT substrate 510, a plurality of first electrodes 520 arranged in a predetermined configuration (e.g., matrix configuration), a wall-like insulating layer 540 which isolates the first electrodes 520 from each other, organic light emitting layers 530 formed on the first electrodes 520, respectively, an auxiliary electrode 500 formed on the wall-like insulating layer 540, a liquid repellent layer 570 which covers the auxiliary electrode 550 and a second electrode 560 which is formed to cover the surfaces of the water repellent layer 570, wall-like insulating layer 540 and auxiliary electrode 550 and electrically connected to the auxiliary electrode 550 via through holes 571. Each of the organic light emitting layers 530 includes a hole transport layer 531 and a light emitting layer 532. The second electrode 560 is transparent to light emitted from the light emitting layer 532.

The TFT substrate 510 includes an insulating substrate 511, TFTs 514 which are connected to the first electrodes 520, respectively, source electrodes 512 and gate electrodes 513 which are electrically connected to the TFTs 514, respectively, and a planarization film 515 for planarizing one of the surfaces of the TFT substrate 510 facing the organic light emitting layers 530.

The liquid repellent layer 570 has liquid repellency. Therefore, even if ink droplets which are ejected to form the organic light emitting layers 530 by inkjet printing reach the surface of the liquid repellent layer 570, the ink droplets slide down to the desired positions. Thus, the ink droplets are prevented from remaining on the liquid repellent layer 570. In this way, the electrical connection between the auxiliary electrode 500 and the second electrode 560 is ensured.

The liquid repellent layer 570 may be made of a polyimide resin doped with a fluorine or silicon-based additive.

The liquid repellent layer 570 may also be provided by forming a film which is not liquid-repellent and giving the film liquid repellency by a certain treatment. Examples of the treatment include a treatment with oxygen plasma or tetrafluorocarbon plasma. Oxygen plasma and tetrafluorocarbon plasma may be used in combination.

Or alternatively, the previously formed auxiliary electrode 550 may be subjected to the oxygen plasma treatment or the tetrafluorocarbon plasma treatment to form the liquid repellent layer 570 at the top surface of the auxiliary electrode 550.

The liquid repellent layer 570 may be a monolayer. The monolayer is extremely thin and has electric conductivity. Therefore, if the liquid repellent layer 570 is a monolayer, the auxiliary electrode 550 and the second electrode 560 are electrically connected without forming the through hole 571 in the liquid repellent layer 570. By so doing, the organic EL element 500 is manufactured more easily.

The monolayer may be made of stearic acid.

In the above description, an explanation is given of the preferred embodiments of the present invention. However, the technical scope of the present invention is not limited to the above description. It should be understood by those skilled in the art that the above-described embodiments are merely for explanation and the combination of the components and steps may be modified and that the modification also falls within the scope of the present invention.

What is claimed is:

1. An organic light emitting element comprising:
   a substrate;
   a plurality of first electrodes which are arranged on the substrate in a matrix configuration;
   a wall-like insulating layer which is arranged on the substrate and isolates the first electrodes from each other;
   organic light emitting layers which are arranged on the first electrodes, respectively;
   an auxiliary electrode which is arranged on top of the wall-like insulating layer; and
   a second electrode which is:
      arranged to cover surfaces of the wall-like insulating layer, the auxiliary electrode, and the light emitting layers;
      electrically connected to the auxiliary electrode; and
      transparent to light from the light emitting layers; wherein
   the auxiliary electrode is arranged on top of part of the wall-like insulating layer; and
   the part of the wall-like insulating layer on top of which the auxiliary electrode is arranged is wider than part of the wall-like insulating layer on top of which the auxiliary electrode is not arranged.

2. An organic light emitting element according to claim 1, wherein the part of the wall-like insulating layer on top of which the auxiliary electrode is arranged about twice or more wider than the part of the wall-like insulating layer on top of which the auxiliary electrode is not arranged.

3. An organic light emitting element according to claim 1, wherein:
   each of the light emitting layers is made of any one of different materials which emit lights of different colors;
   the light emitting layers which emit lights of different colors have different light emitting areas; and
   the part of the wall-like insulating layer on which the auxiliary electrode is arranged is adjacent to the light emitting layers having the smallest light emitting area.

4. An organic light emitting element according to claim 1 further comprising a liquid repellent layer which is arranged between the auxiliary electrode and the second electrode and provided with a through hole which communicates with the auxiliary electrode and the second electrode; wherein
   the second electrode is electrically connected to the auxiliary electrode via the through hole.

5. An organic light emitting element according to claim 1 further comprising a liquid repellent layer which is a monolayer arranged between the auxiliary electrode and the second electrode.

6. An organic light emitting element according to claim 1 wherein the light emitting layers contain organic electroluminescent light emitting material.

7. A display device including an organic light emitting element according to claim 1.

8. An organic light emitting element comprising:
   a substrate;
   a plurality of first electrodes which are arranged on the substrate in a matrix configuration;
   a wall-like insulating layer which is arranged on the substrate and isolates the first electrodes from each other;
   organic light emitting layers which are arranged on the first electrodes, respectively;
   an auxiliary electrode which is arranged on top of the wall-like insulating layer; and
   a second electrode which is:
      arranged to cover surfaces of the wall-like insulating layer, the auxiliary electrode, and the light emitting layers;
      electrically connected to the auxiliary electrode; and
      transparent to light from the light emitting layers; wherein
   the auxiliary electrode is divided into multiple fragmentary electrodes on top of part of the wall-like insulating layer; and
   the part of the wall-like insulating layer on top of which the auxiliary electrode is arranged is wider than part of the wall-like insulating layer on top of which the auxiliary electrode is not arranged.

9. An organic light emitting element according to claim 8, wherein the part of the wall-like insulating layer on top of which the auxiliary electrode is arranged is about twice or more wider than the part of the wall-like insulating layer on top of which the auxiliary electrode is not arranged.

10. An organic light emitting element according to claim 8, wherein:
    each of the light emitting layers is made of any one of different materials which emit lights of different colors;
    the light emitting layers which emit lights of different colors have different light emitting areas; and
    the part of the wall-like insulating layer on which the auxiliary electrode is arranged is adjacent to the light emitting layers having the smallest light emitting area.

11. An organic light emitting element according to claim 8, further comprising a liquid repellent layer which is arranged between the auxiliary electrode and the second electrode and provided with a through hole which communicates with the auxiliary electrode and the second electrode; wherein
    the second electrode is electrically connected to the auxiliary electrode via the through hole.

12. An organic light emitting element according to claim 8, further comprising a liquid repellent layer which is a monolayer arranged between the auxiliary electrode and the second electrode.

13. An organic light emitting element according to claim 8, wherein the light emitting layers contain organic electroluminescent light emitting material.

14. A display device including an organic light emitting element according to claim 8.

* * * * *